United States Patent
Tanaka

(10) Patent No.: US 10,109,576 B2
(45) Date of Patent: Oct. 23, 2018

(54) CAPACITOR MOUNTING STRUCTURE

(71) Applicant: Murata Manufacturing Co., Ltd., Nagaokakyo-shi, Kyoto-fu (JP)

(72) Inventor: Daisuke Tanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/825,188

(22) Filed: Nov. 29, 2017

(65) Prior Publication Data
US 2018/0158772 A1 Jun. 7, 2018

(30) Foreign Application Priority Data
Dec. 1, 2016 (JP) ................... 2016-233870

(51) Int. Cl.
*H01L 23/522* (2006.01)
*H01L 23/50* (2006.01)

(52) U.S. Cl.
CPC .......... *H01L 23/5223* (2013.01); *H01L 23/50* (2013.01); *H01L 2924/141* (2013.01); *H01L 2924/30105* (2013.01)

(58) Field of Classification Search
CPC ................. H01L 23/5223; H01L 23/50; H01L 2924/141; H01L 2924/30105
See application file for complete search history.

(56) References Cited

U.S. PATENT DOCUMENTS 9,974,165 B2 * 5/2018 Gouchi ............... H05K 1/0287
2011/0042795 A1 * 2/2011 Knickerbocker ..... H01L 21/486
257/686

FOREIGN PATENT DOCUMENTS

JP 2009-81183 A 4/2009

* cited by examiner

*Primary Examiner* — Yosef Gebreyesus
(74) *Attorney, Agent, or Firm* — Keating & Bennett, LLP

(57) ABSTRACT

A mounting structure includes a silicon die, an interposer, a substrate, and a capacitor. The capacitor includes a multilayer body, a first outer electrode provided on one end surface of the multilayer body, a second outer electrode provided on another end surface of the multilayer body, and a third outer electrode provided on side surfaces of the multilayer body, and a portion of the capacitor at the first outer electrode side is embedded within the interposer. The first outer electrode is connected to a power supply terminal of the silicon die through a via of the interposer. The second outer electrode is connected to a power supply pattern on the substrate. The third outer electrode is connected to a ground pattern within the interposer.

20 Claims, 4 Drawing Sheets

CAPACITOR MOUNTING STRUCTURE

CROSS REFERENCE TO RELATED APPLICATIONS

This application claims the benefit of priority to Japanese Patent Application No. 2016-233870 filed on Dec. 1, 2016. The entire contents of this application are hereby incorporated herein by reference.

BACKGROUND OF THE INVENTION

1. Field of the Invention

The present invention relates to a mounting structure for a capacitor to be mounted between ground and a power supply of a semiconductor integrated circuit.

2. Description of the Related Art

On a board on which a semiconductor integrated circuit such as an IC is mounted, a bypass capacitor (decoupling capacitor) is mounted, for example, between ground and a power supply of the semiconductor integrated circuit in order to remove noise or suppress voltage fluctuations during operation of the semiconductor integrated circuit. When the bypass capacitor is mounted, power supply impedance is desirably low from the viewpoint of suppressing voltage fluctuations.

As a technique to mount a bypass capacitor, there is a technique to embed the bypass capacitor into a board in order to provide the bypass capacitor in close proximity to a semiconductor integrated circuit. As an example of the technique, Japanese Unexamined Patent Application Publication No. 2009-81183 discloses a wiring board in which a capacitor unit including a plurality of multilayer chip capacitors integrated is embedded in a board body. Each multilayer chip capacitor includes a chip body in which dielectric ceramic layers and inner electrode layers are alternately laminated, and outer electrodes that are formed on end surfaces of the chip body and electrically connected to the inner electrode layers. By the outer electrodes of the respective multilayer chip capacitors being connected to each other, a capacitor unit including three terminals is formed. Vias provided within the wiring board are connected to the respective terminals (outer electrodes) of the capacitor unit, and the respective terminals are electrically connected to respective wires of the wiring board via the respective vias.

However, in the technique disclosed in Japanese Unexamined Patent Application Publication No. 2009-81183, the lamination direction of the capacitor unit (the multilayer chip capacitors) is the same as the thickness direction of the wiring board (the direction in which the vias extend), and thus the area of a portion of each outer electrode that is connected to the vias is small. Therefore, only a small number of vias including a small diameter (for example, one via in the example shown in FIG. 5 of Japanese Unexamined Patent Application Publication No. 2009-81183) are connected to each outer electrode of the capacitor unit. Accordingly, the total cross-sectional area of the vias connected to each outer electrode is small, and thus the inductance becomes high. When the bypass capacitor is embedded in the board as described above, required power supply impedance is not satisfied, and it may be impossible to supply stable power to the semiconductor integrated circuit.

Meanwhile, a semiconductor integrated circuit may be connected to a substrate via an interposer, and a bypass capacitor may be embedded in the interposer. When the bypass capacitor is embedded in the interposer, the thickness of the interposer increases in response to the size of the bypass capacitor. However, reduction in the thickness of the interposer is desired with size reduction or thickness reduction of various electronic devices in which the semiconductor integrated circuit is included.

SUMMARY OF THE INVENTION

Preferred embodiments of the present invention provide capacitor mounting structures that allow a thickness of an interposer to be significantly reduced while significantly reducing power supply impedance if a bypass capacitor is mounted within the interposer.

According to a preferred embodiment of the present invention, a capacitor mounting structure includes a semiconductor integrated circuit, a substrate, an interposer located between the semiconductor integrated circuit and the substrate, and a capacitor electrically connected between ground and a power supply of the semiconductor integrated circuit, the capacitor includes a multilayer body in which first inner electrodes and second inner electrodes are alternately laminated with dielectric layers interposed therebetween, a first outer electrode provided on one end surface of the multilayer body and connected to the first inner electrodes, a second outer electrode provided on another end surface opposing the one end surface of the multilayer body and connected to the first inner electrodes, and a third outer electrode provided on a pair of opposing side surfaces of the multilayer body and connected to the second inner electrodes, and a portion of the capacitor at the first outer electrode side is embedded within the interposer, the first outer electrode is electrically connected to a power supply terminal of the semiconductor integrated circuit through a via provided within the interposer, the second outer electrode is electrically connected to a power supply pattern on the substrate, and the third outer electrode is electrically connected to a ground pattern provided within the interposer or on a lower surface of the interposer.

In a capacitor mounting structure according to a preferred embodiment of the present invention, the three-terminal capacitor (multilayer capacitor) including the first to third outer electrodes is included as a bypass capacitor between the ground and the power supply of the semiconductor integrated circuit, a portion of the capacitor at the first outer electrode side is embedded within the interposer, and the remaining portion thereof at the second outer electrode side is exposed outside the interposer.

In a capacitor mounting structure according to a preferred embodiment of the present invention, the first outer electrode of the capacitor at one end side is electrically connected to the power supply terminal of the semiconductor integrated circuit through a via within the interposer, the second outer electrode at the other end side is electrically connected to the power supply pattern on the substrate, and the third outer electrode in an intermediate portion is electrically connected to the ground pattern defined within the interposer or on the lower surface of the interposer, and thus the capacitor is mounted within the interposer and on the substrate. When the capacitor is mounted as described above, the first outer electrode and the second outer electrode of the capacitor are located perpendicular or substantially perpendicular to the thickness direction of the interposer (the direction in which the via extends), and thus the area of a portion of the first outer electrode that is connected to the via is large. Therefore, it is possible to increase the total cross-sectional area of the via connected to the first outer electrode, and it is possible to significantly reduce the inductance of the via. In addition, since the second outer electrode side of the capacitor is exposed outside the interposer, it is possible to directly connect the second outer electrode to the power supply pattern on the substrate. Moreover, it is possible to connect the third outer electrode to the ground pattern within the interposer. Furthermore, it is possible to provide the capacitor in close proximity to the semiconductor integrated circuit and to significantly reduce the inductance of a wire. As a result, it is possible to significantly reduce the inductance in a loop between the ground and the power supply of the semiconductor integrated circuit. In addition, since the capacitor is a third-terminal capacitor, it is possible to significantly reduce the inductance.

Accordingly, with a capacitor mounting structure according to a preferred embodiment of the present invention, if the bypass capacitor is mounted within the interposer, it is possible to significantly reduce the power supply impedance, and it is possible to supply stable power to the semiconductor integrated circuit. Moreover, according to a capacitor mounting structure according to a preferred embodiment of the present invention, since a portion of the capacitor is embedded within the interposer and the remaining portion of the capacitor is exposed outside the interposer (the entirety of the capacitor is not embedded within the interposer), it is possible to significantly reduce the thickness of the interposer.

According to a preferred embodiment of the present invention, a capacitor mounting structure includes a semiconductor integrated circuit, a substrate, an interposer located between the semiconductor integrated circuit and the substrate, and a capacitor electrically connected between ground and a power supply of the semiconductor integrated circuit, the capacitor includes a multilayer body in which first inner electrodes and second inner electrodes are alternately laminated with dielectric layers interposed therebetween, a first outer electrode provided on one end surface of the multilayer body and connected to the first inner electrodes, a second outer electrode provided on another end surface opposing the one end surface of the multilayer body and connected to the first inner electrodes, and a third outer electrode provided on a pair of opposing side surfaces of the multilayer body and connected to the second inner electrodes, and a portion of the capacitor at the first outer electrode side is embedded within the interposer, the first outer electrode is electrically connected to a ground terminal of the semiconductor integrated circuit through a via provided within the interposer, the second outer electrode is electrically connected to a ground pattern on the substrate, and the third outer electrode is electrically connected to a power supply pattern provided within the interposer or on a lower surface of the interposer.

In a capacitor mounting structure according to a preferred embodiment of the present invention, similarly to the above-described capacitor mounting structure, a portion of the third-terminal capacitor at the first outer electrode side is embedded within the interposer, and the remaining portion thereof at the second outer electrode side is exposed outside the interposer. In a capacitor mounting structure according to a preferred embodiment of the present invention, the first outer electrode of the capacitor at one end side is electrically connected to the ground terminal of the semiconductor integrated circuit through a via within the interposer, the second outer electrode at the other end side is electrically connected to the ground pattern on the substrate, and the third outer electrode in an intermediate portion is electrically connected to the power supply pattern in or on the interposer, and thus the capacitor is mounted within the interposer and on the substrate. When the capacitor is mounted as described above, similarly to the above-described capacitor mounting structure, it is possible to increase the total cross-sectional area of the via connected to the first outer electrode, and it is possible to significantly reduce the inductance of the via. In addition, since the second outer electrode side of the capacitor is exposed outside the interposer, it is possible to directly connect the second outer electrode to the ground pattern on the substrate. Moreover, it is possible to connect the third outer electrode to the power supply pattern within the interposer or the like. As a result, it is possible to significantly reduce the inductance in a loop between the ground and the power supply of the semiconductor integrated circuit. In addition, since the capacitor is a third-terminal capacitor, it is possible to significantly reduce the inductance. Accordingly, with a capacitor mounting structure according to a preferred embodiment of the present invention, if the bypass capacitor is mounted within the interposer, it is possible to significantly reduce the power supply impedance, and it is possible to supply stable power to the semiconductor integrated circuit. Moreover, with a capacitor mounting structure according to a preferred embodiment of the present invention, since a portion of the capacitor is embedded within the interposer and the remaining portion of the capacitor is exposed outside the interposer, it is possible to significantly reduce the thickness of the interposer.

In a capacitor mounting structure according to a preferred embodiment of the present invention, the first inner electrodes and the second inner electrodes of the capacitor are preferably located perpendicular or substantially perpendicular to an upper surface of the substrate. Accordingly, it is easy to locate the first outer electrode, which is provided on the one end surface of the multilayer body, at the semiconductor integrated circuit side and locate the second outer electrode, which is provided on the other end surface of the multilayer body, at the substrate side, and it is easy to include the third outer electrode in an intermediate portion therebetween.

In a capacitor mounting structure according to a preferred embodiment of the present invention, the third outer electrode is preferably an electrode provided continuously on the pair of side surfaces and a pair of surfaces orthogonal or substantially orthogonal to the pair of side surfaces and orthogonal or substantially orthogonal to the pair of end surfaces. Accordingly, since the third outer electrode is located on the entire periphery of the multilayer body, the flexibility in a connection destination of the third outer electrode is increased, and it is possible to significantly improve the work efficiency in connecting the third outer electrode and the ground pattern or the power supply pattern within the interposer.

In a capacitor mounting structure according to a preferred embodiment of the present invention, preferably, the first outer electrode is included within the interposer, the second outer electrode is located outside the interposer and along an upper surface of the substrate, and at least a portion of the third outer electrode is included within the interposer. Accordingly, it is possible to connect the first outer electrode, the second outer electrode, and the third outer electrode as described above.

In a capacitor mounting structure according to a preferred embodiment of the present invention, the first outer electrode is preferably located parallel or substantially parallel to an upper surface of the interposer. Accordingly, it is possible to easily connect the via within the interposer to the first outer electrode.

In a capacitor mounting structure according to a preferred embodiment of the present invention, the interposer preferably includes silicon. Accordingly, it is possible to provide an interposer that is thin.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
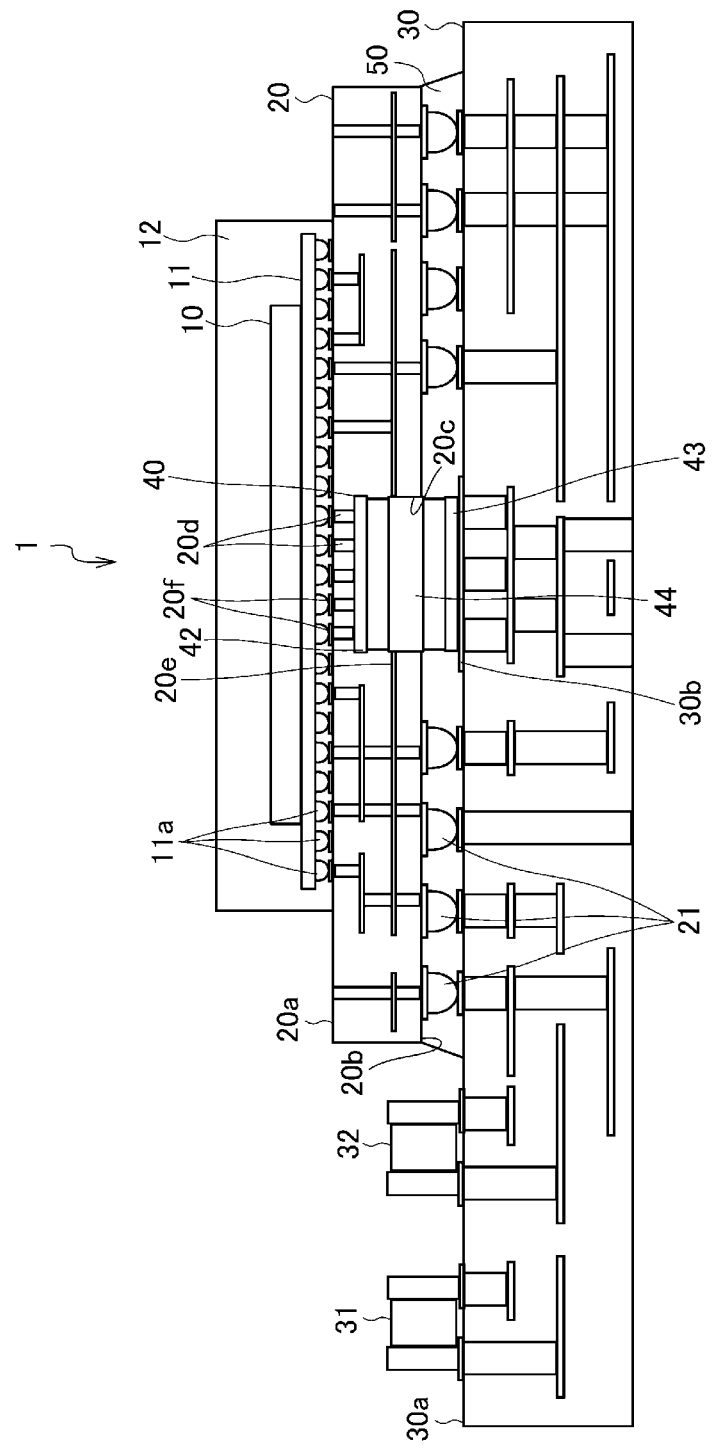
FIG. 1 is a cross-sectional view showing a capacitor mounting structure according to a preferred embodiment of the present invention.

Hereinafter, preferred embodiments of the present invention will be described in detail with reference to the drawings. In the drawings, the same or corresponding elements are designated by the same reference characters. In addition, in each drawing, the same elements are designated by the same reference characters and the overlap description thereof is omitted.

A capacitor mounting structure 1 according to a preferred embodiment of the present invention will be described with reference to FIG. 1. FIG. 1 is a cross-sectional view showing the capacitor mounting structure 1. In the cross-sectional view of FIG. 1, for easy viewing, hatching is omitted.

The mounting structure 1 includes a silicon die 10 (corresponding to a semiconductor integrated circuit recited in the claims), an interposer 20, a substrate 30, and a capacitor 40. The capacitor 40 is a bypass capacitor electrically connected between ground and a power supply of the silicon die 10. FIG. 1 shows one capacitor 40, but a predetermined number of capacitors are actually mounted as bypass capacitors for the silicon die 10.

The silicon die 10 is a chip including a semiconductor integrated circuit defined therein. The silicon die 10 is, for example, a silicon die for an APU (Application Processing Unit). The silicon die 10 is mounted on the interposer 20 via a board 11 (so-called "space"). For example, semispherical or substantially semispherical solder balls 11a (bumps) arranged in a grid are provided on a lower surface of the board 11 in order to mount the interposer 20. By the interposer 20 being mounted on the substrate 30, the silicon die 10 is electrically connected to the substrate 30 via the interposer 20. The silicon die 10 is supplied with power, for example, from a power supply circuit (not shown) provided in or on the substrate 30. The silicon die 10 and the board 11 are sealed by a sealing material 12, for example, a resin, and packaged.

The interposer 20 is a board that connects between the silicon die 10 and the substrate 30 while supporting the silicon die 10 (board 11). The interposer 20 converts a terminal interval between the board 11 of the silicon die 10 and the substrate 30 and is mounted on the substrate 30, thus electrically connecting the silicon die 10 to the substrate 30. The interposer 20 is a silicon interposer including silicon.

The interposer 20 is a multilayer wiring board in which a plurality of wiring layers (wiring patterns) and a plurality of insulator layers are laminated. The silicon die 10 is mounted on an upper surface (top surface) 20a of the interposer 20 via the board 11. To mount the silicon die 10, for example, a printed wiring pattern including a copper foil or the like is provided on the upper surface 20a of the interposer 20, and the solder balls 11a of the board 11 are electrically connected to the printed wiring pattern. On a lower surface (bottom surface) 20b of the interposer 20, semispherical or substantially semispherical solder balls 21 arranged in a grid are provided. As described above, the interposer 20 is, for example, a BGA (Ball Grid Array) type board.

The capacitor 40 is mounted with a portion of the capacitor 40 embedded within the interposer 20. In order to mount the portion of the capacitor 40, a cavity 20c is provided in the interposer 20 to be open at the lower surface 20b side. In addition, wiring patterns (a power supply pattern, a ground pattern, a signal pattern) and vias are provided within the interposer 20. The capacitor 40 is located, for example, directly below the silicon die 10. The method of mounting the capacitor 40 will be described in detail later.

The substrate 30 is a multilayer wiring board in which a plurality of wiring layers (wiring patterns) and a plurality of insulator layers are laminated. For example, a printed wiring pattern including a copper foil or the like is provided on an upper surface 30a of the substrate 30. The above-described solder balls 21 of the interposer 20 are electrically connected to the printed wiring pattern. A portion at which the interposer 20 and the substrate 30 are connected to each other is sealed, for example, by underfill 50. Wiring patterns (a power supply pattern, a ground pattern, a signal pattern) and vias are provided within the substrate 30.

One end side of the capacitor 40 is mounted on the upper surface 30a of the substrate 30. In addition, a bulk capacitor 31, a board capacitor 32, and the like are mounted on the upper surface 30a of the substrate 30. The bulk capacitor 31 is a capacitor that covers impedance in a low frequency range. The board capacitor 32 is a capacitor that covers impedance in a higher frequency range than that of the bulk capacitor 31. Although not shown in FIG. 1, a power supply circuit is mounted on the substrate 30.

Figure 2:
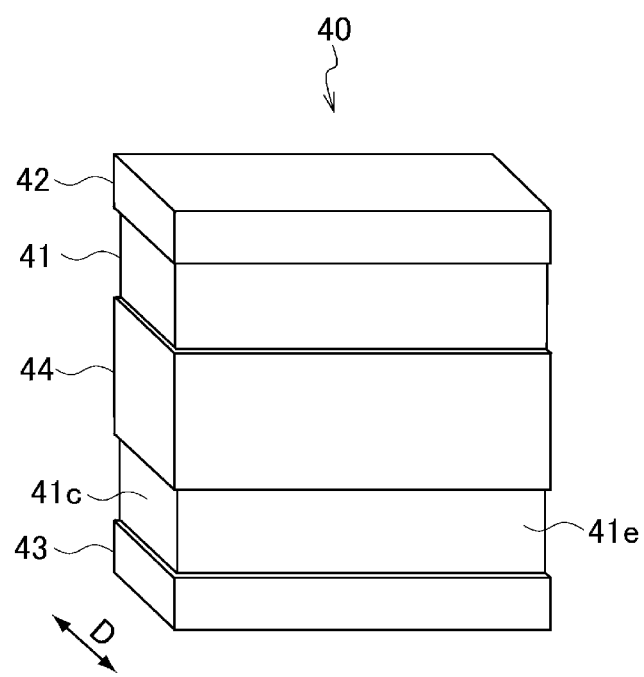
FIG. 2 is a perspective view of a capacitor included in the capacitor mounting structure shown in FIG. 1.
Figure 3A:
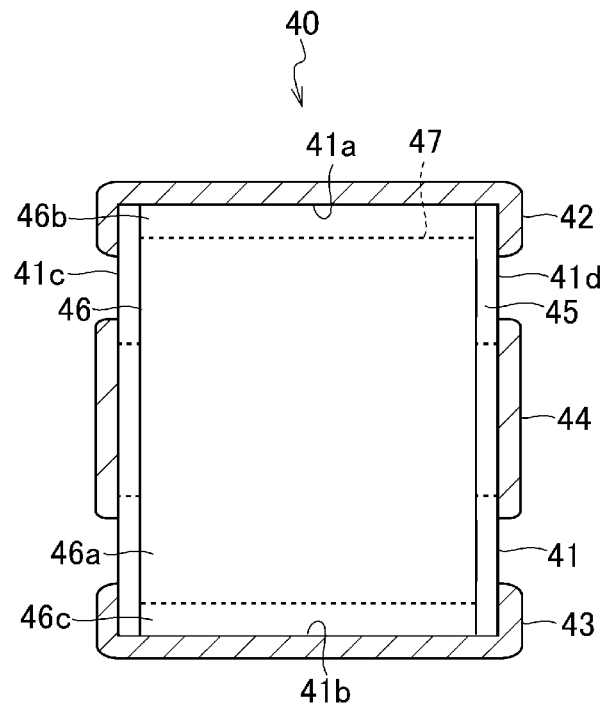
FIG. 3A is a plan cross-sectional view of the capacitor shown in FIG. 2, at a location at which a first inner electrode is located.
Figure 3B:
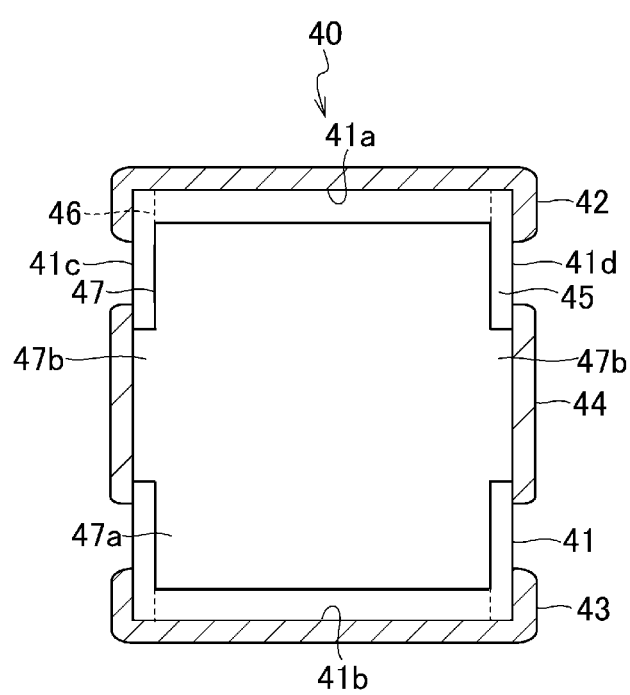
FIG. 3B is a plane cross-sectional view of the capacitor shown in FIG. 2, at a location at which a second inner electrode is located.

The capacitor 40 will be described with reference to FIGS. 2, 3A, and 3B. FIG. 2 is a perspective view of the capacitor 40 included in the capacitor mounting structure 1 shown in FIG. 1. FIG. 3A is a plan cross-sectional view of the capacitor 40 shown in FIG. 2, at a location at which a first inner electrode 46 is located, and FIG. 3B is a plan cross-sectional view of the capacitor 40 shown in FIG. 2, at a location at which a second inner electrode 47 is located.

The capacitor 40 is a bypass capacitor as described above. The capacitor 40 significantly reduces or prevents voltage fluctuations of power during operation of the silicon die 10, eliminates noise (for example, noise entering the power supply and the ground, noise generated through operation of the silicon die 10), and the like.

The capacitor 40 is a multilayer ceramic chip capacitor and includes a rectangular parallelepiped or a substantially rectangular parallelepiped shape. The capacitor 40 includes a multilayer body 41, a first outer electrode 42, a second outer electrode 43, and a third outer electrode 44.

The capacitor 40 is a three-terminal capacitor including the first outer electrode 42 and the second outer electrode 43 that are power supply terminals, and the third outer electrode 44 that is a ground terminal. The first outer electrode 42 is provided on an end surface 41a of a pair of opposing end surfaces 41a and 41b of the multilayer body 41. The second outer electrode 43 is provided on the other end surface 41b. The first outer electrode 42 and the second outer electrode 43 are provided not only on the end surfaces 41a and 41b of the multilayer body 41 but also on portions of principal surfaces 41e and 41f and portions of side surfaces 41c and 41d of the multilayer body 41. The third outer electrode 44 is an electrode that is provided continuously on a pair of the opposing side surfaces 41c and 41d and a pair of the principal surfaces 41e and 41f of the multilayer body 41.

The multilayer body 41 includes a plurality of dielectric layers 45, a plurality of first inner electrodes 46, and a plurality of second inner electrodes 47. In the multilayer body 41, the first inner electrodes 46 and the second inner electrodes 47 are alternately laminated with the dielectric layers 45 interposed therebetween. The multilayer body 41 includes a rectangular parallelepiped or a substantially rectangular parallelepiped shape, and the pair of opposing end surfaces 41a and 41b and the pair of opposing side surfaces 41c and 41d are located between the pair of opposing principal surfaces 41e and 41f.

Each dielectric layer 45 preferably is a film including a rectangular parallelepiped or a substantially rectangular shape. Each dielectric layer 45 preferably includes, for example, a dielectric ceramic material containing $BaTiO_3$, $CaTiO_3$, $SrTiO_3$, $CaZrO_3$, or the like as a principal component. A secondary component, for example, a Mn compound, a Fe compound, a Cr compound, a Co compound, and a Ni compound may be added to the principal component.

Each inner electrode 46 or 47 preferably is a thin film. For example, Ni, Cu, Ag, Pd, an Ag—Pd alloy, Au, or the like is included in each inner electrode 46 or 47. The first inner electrodes 46 and the second inner electrodes 47 are alternately laminated to oppose each other with the dielectric layers 45 interposed therebetween.

As shown in FIG. 3A, each first inner electrode 46 includes a main body portion 46a, an extended portion 46b, and an extended portion 46c. The main body portion 46a includes a rectangular parallelepiped or a substantially rectangular shape. The main body portion 46a opposes a main body portion 47a of the second inner electrode 47 with the dielectric layer 45 interposed therebetween. The extended portion 46b is provided at one end portion of the main body portion 46a (an end portion at the end surface 41a side of the multilayer body 41). The extended portion 46b includes a width equal or substantially equal to the width of the main body portion 46a. The extended portion 46b is connected to the first outer electrode 42. The extended portion 46c is provided at another end portion of the main body portion 46a (an end portion at the end surface 41b side of the multilayer body 41). The extended portion 46c includes a width equal or substantially equal to the width of the main body portion 46a. The extended portion 46c is connected to the second outer electrode 43.

As shown in FIG. 3B, each second inner electrode 47 includes a main body portion 47a and a pair of extended portions 47b. The main body portion 47a opposes the main body portion 46a of the first inner electrode 46 with the dielectric layer 45 interposed therebetween and includes a rectangular parallelepiped or a substantially rectangular shape similarly to the main body portion 46a. The extended portions 47b are provided at opposing end portions of the main body portion 47a (end portions at the opposing side surfaces 41c and 41d sides of the multilayer body 41), respectively. Each extended portion 47b includes a width smaller than that of the third outer electrode 44 and includes a predetermined length. The extended portions 47b are connected to the third outer electrode 44.

Each of the first to third outer electrodes 42, 43, and 44 includes a Cu electrode and a plating layer (for example, a nickel plating layer and a tin plating layer covering the nickel plating layer) that covers the Cu electrode. The first outer electrode 42 is connected to the extended portions 46b of the plurality of first inner electrodes 46. The second outer electrode 43 is connected to the extended portions 46c of the plurality of first inner electrodes 46. The third outer electrode 44 is connected to the pairs of extended portions 47b of the plurality of second inner electrodes 47.

Referring back to FIG. 1, the method of mounting the capacitor 40 will be described. A portion at the first outer electrode 42 side of the capacitor 40 is embedded within the cavity 20c of the interposer 20. The cavity 20c includes a depth enough to receive at least a portion of the third outer electrode 44. The remaining portion at the second outer electrode 43 side of the capacitor 40 is exposed at an outer side portion of the interposer (the substrate 30 side). The second outer electrode 43 of the capacitor 40 is located along the upper surface 30a of the substrate 30.

Since the capacitor 40 is provided as described above, a lamination direction D of the capacitor 40 is parallel or substantially parallel to the upper surface 30a of the substrate 30. Therefore, the first inner electrodes 46 and the second inner electrodes 47 of the capacitor 40 are located perpendicular or substantially perpendicular to the upper surface 30a of the substrate 30. In addition, the end surfaces 41a and 41b of the multilayer body 41 of the capacitor 40 are located parallel or substantially parallel to the upper surface 30a of the substrate and orthogonal or substantially orthogonal to the thickness direction of the interposer 20. Therefore, the first outer electrode 42 (a portion provided on the end surface 41a) and the second outer electrode 43 (a portion provided on the end surface 41b) of the capacitor 40 are located parallel or substantially parallel to the upper surface 20a of the interposer 20 and the upper surface 30a of the substrate 30. Moreover, the first outer electrode 42 and the second outer electrode 43 are located orthogonal or substantially orthogonal to the thickness direction of the interposer 20 (the direction in which the vias within the interposer 20 extend). Accordingly, the area of a portion of the first outer electrode 42 that is connected to the vias is increased.

The first outer electrode 42 is electrically connected to a plurality of vias 20d provided within the interposer 20. The plurality of vias 20d are vias that electrically connect the first outer electrode 42 of the capacitor 40 to a power supply pattern 20f defined on the upper surface 20a of the interposer 20. The power supply pattern 20f is electrically connected to the solder balls 11a of the power supply terminal of the board 11 of the silicon die 10.

The second outer electrode 43 is electrically connected to a power supply pattern 30b provided on the upper surface 30a of the substrate 30. The power supply pattern 30b is connected to the power supply circuit through the vias and the power supply pattern within the substrate 30.

The third outer electrode 44 is electrically connected to a ground pattern 20e provided within the interposer 20. The ground pattern 20e is connected to ground of the substrate 30 and the solder balls 11a of the ground terminal of the board 11 of the silicon die 10 through the vias within the interposer 20 and the like.

The vias provided within the interposer 20 all preferably have the same or substantially the same diameter. The number of the vias 20d connected to the first outer electrode 42 is desirably as large as possible in consideration of the diameters (cross-sectional areas of the vias) and the area at the end surface 41a side of the first outer electrode 42. It is possible to increase the total cross-sectional area of the vias 20d connected in parallel, as the number of the vias 20d is increased. In addition, the axial lengths of the vias 20d are desirably short.

Advantageous effects of the mounting structure 1 will be described. In the mounting structure 1, the portion of the capacitor 40 is included within the interposer 20, and the remaining portion of the capacitor 40 is exposed outside the interposer 20. Therefore, it is not necessary to house the entirety of the capacitor 40 within the interposer 20, and thus it is possible to significantly reduce the thickness of the interposer 20. In particular, since the interposer 20 includes silicon, the thickness of the interposer 20 is able to be smaller than that of an interposer including glass epoxy.

In the mounting structure 1, since the area of the portion of the first outer electrode 42 of the capacitor 40 that is connected to the vias is large as described above, it is possible to increase the number of the vias connected to the first outer electrode 42. Therefore, it is possible to increase the total cross-sectional area of the many vias 20d, and it is possible to significantly reduce the total inductance of the vias connected in parallel to the first outer electrode 42. Furthermore, it is possible to significantly reduce the inductance by decreasing the lengths of the vias 20d.

In the mounting structure 1, it is possible to expose the second outer electrode 43 side of the capacitor 40 outside the interposer 20 and include the second outer electrode 43 along the upper surface 30a of the substrate 30. Accordingly, it is possible to directly connect the second outer electrode 43 of the capacitor 40 to the power supply pattern 30b on the upper surface 30a of the substrate 30, and thus it is possible to decrease the inductance of the wires.

In the mounting structure 1, by including at least a portion of the third outer electrode 44 of the capacitor 40 within the interposer 20, it is possible to connect the third outer electrode 44 to the ground pattern 20e within the interposer 20. Accordingly, it is possible to shorten the wire at the ground side, and it is possible to decrease the inductance of the wire.

In the mounting structure 1, by including the capacitor 40 within the interposer 20 and directly below the silicon die 10, it is possible to locate the capacitor 40 in close proximity to the silicon die 10. Accordingly, it is possible to shorten the wires in the entirety of a loop between the ground and the power supply of the silicon die 10.

Due to the above, in the mounting structure 1, it is possible to significantly reduce the inductance in the loop between the ground and the power supply of the silicon die 10, and it is possible to decrease the power supply impedance. In addition, in the mounting structure 1, since the capacitor 40 is a three-terminal capacitor, it is possible to decrease the inductance.

Figure 4:
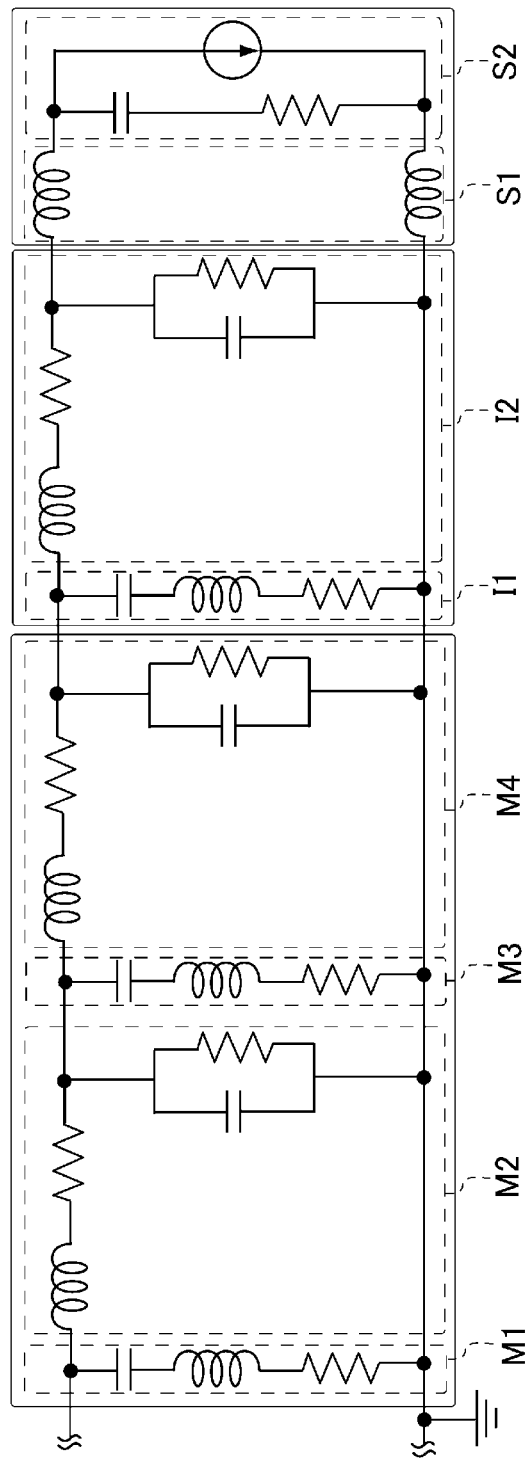
FIG. 4 is a diagram showing the equivalent circuit of a PDN to which the capacitor mounting structure shown in FIG. 1 is applied.

FIG. 4 shows an equivalent circuit of the entirety of a power distribution network (PDN) to which the capacitor mounting structure 1 shown in FIG. 1 is applied. The equivalent circuit surrounded by a broken line denoted by reference character M1 is the equivalent circuit of the bulk capacitor 31 provided on the substrate 30. The equivalent circuit surrounded by a broken line denoted by reference character M2 is an equivalent circuit of a wire and the like of the substrate 30. The equivalent circuit surrounded by a broken line denoted by reference character M3 is the equivalent circuit of the board capacitor 32 provided on the substrate 30. The equivalent circuit surrounded by a broken line denoted by reference character M4 is an equivalent circuit of the wire and the like of the substrate 30.

The equivalent circuit surrounded by a broken line denoted by reference character I1 is the equivalent circuit of the capacitor 40 mounted within the interposer 20. The equivalent circuit surrounded by a broken line denoted by reference character is the equivalent circuit of the wire and the like of the interposer 20.

The equivalent circuit surrounded by a broken line denoted by reference character S1 is the equivalent circuit of the board 11 and the like to mount the silicon die 10 on the interposer 20. The equivalent circuit surrounded by a broken line denoted by reference character S2 is the equivalent circuit of the silicon die 10.

By applying the mounting structure 1 according to the present preferred embodiment, it is possible to decrease the impedance in the equivalent circuit surrounded by the broken line denoted by reference character I2 and the equivalent circuit surrounded by the broken line denoted by reference character S1 in the equivalent circuit of the entirety of the power distribution network. In addition, since the three-terminal capacitor 40 is included, it is possible to decrease the impedance in the equivalent circuit surrounded by the broken line denoted by reference character I1.

According to the mounting structure 1, if the capacitor 40 is mounted within the interposer 20, since it is possible to decrease the inductance as described above, it is possible to decrease the power supply impedance between ground and the power supply of the silicon die 10. Accordingly, it is possible to supply stable power to the silicon die 10.

According to the mounting structure 1, the portion of the capacitor 40 is embedded within the interposer 20 and the remaining portion thereof is exposed outside the interposer 20 (the entirety of the capacitor 40 is not embedded in the interposer 20), it is possible to significantly reduce the thickness of the interposer 20. In particular, even when the capacitor 40 including a large capacitance is included and it is not possible to significantly reduce the size of the capacitor 40, it is possible to significantly reduce the thickness of the interposer 20. According to the mounting structure 1, since the interposer 20 includes silicon, it is possible to provide a thin interposer.

In the mounting structure 1, the first inner electrodes 46 and the second inner electrodes 47 of the capacitor 40 are perpendicular or substantially perpendicular to the upper surface 30a of the substrate 30. Accordingly, it is easy to provide the first outer electrode 42 of the capacitor 40 at the silicon die 10 side and provide the second outer electrode 43 at the substrate 30 side, and it is also easy to provide the third outer electrode 44 in an intermediate portion therebetween.

In the mounting structure 1, by continuously providing the third outer electrode 44 on the side surfaces 41c and 41d and the principal surfaces 41e and 41f of the multilayer body 41, the third outer electrode 44 is located on the entire periphery of the multilayer body 41. By including the third outer electrode 44 on the entire periphery as described above, it is possible to establish a connection to the third outer electrode 44 at any location on the entire periphery, the flexibility in a connection destination of the third outer electrode 44 is increased, and it is possible to significantly improve the work efficiency in connecting the third outer electrode 44 and the ground pattern 20e within the interposer 20.

Although preferred embodiments of the present invention have been described above, the present invention is not limited to the above preferred embodiments, and various changes may be made. For example, in the preferred embodiments described above, the first outer electrode 42 is electrically connected to the power supply terminal of the board 11 through the vias 20d, the second outer electrode 43 is electrically connected to the power supply pattern 30b on the substrate 30, and the third outer electrode 44 is electrically connected to the ground pattern 20e within the interposer 20. The connection destinations of the first to third outer electrodes of the capacitor may be modified. For example, the first outer electrode (ground terminal) of the capacitor is electrically connected to the ground terminal of the board of the silicon die through a via within the interposer. The second outer electrode (ground terminal) of the capacitor is electrically connected to a ground pattern on the upper surface of the substrate. The third outer electrode (power supply terminal) of the capacitor is electrically connected to the power supply pattern within the interposer. However, the same or similar advantageous effects as those of the mounting structure 1 are provided.

In the preferred embodiments described above, the third outer electrode 44 of the capacitor 40 is electrically connected to the ground pattern 20e within the interposer 20. However, the third outer electrode 44 of the capacitor 40 may be electrically connected to a ground pattern provided on the lower surface of the interposer 20 according to preferred embodiments of the present invention.

In the preferred embodiments described above, the third outer electrode 44 of the capacitor 40 is an electrode provided on the side surfaces 41c and 41d and the principal surfaces 41e and 41f of the multilayer body 41, that is, on the entire periphery of the multilayer body 41. However, a pair of third outer electrodes may be provided on the pair of side surfaces 41c and 41d of the capacitor 40, respectively, according to preferred embodiments of the present invention.

In the preferred embodiment described above, the interposer 20 includes silicon. However, preferred embodiments of the present invention may be applied to an interposer including another material, for example, glass epoxy.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A capacitor mounting structure comprising:
   a semiconductor integrated circuit;
   a substrate;
   an interposer located between the semiconductor integrated circuit and the substrate; and
   a capacitor electrically connected between ground and a power supply of the semiconductor integrated circuit; wherein
   the capacitor includes a multilayer body in which first inner electrodes and second inner electrodes are alternately laminated with dielectric layers interposed therebetween, a first outer electrode provided on one end surface of the multilayer body and connected to the first inner electrodes, a second outer electrode provided on another end surface opposing the one end surface of the multilayer body and connected to the first inner electrodes, and a third outer electrode provided on a pair of opposing side surfaces of the multilayer body and connected to the second inner electrodes, and a portion of the capacitor at the first outer electrode side is embedded within the interposer;
   the first outer electrode is electrically connected to a power supply terminal of the semiconductor integrated circuit through a via provided within the interposer;
   the second outer electrode is electrically connected to a power supply pattern on the substrate; and
   the third outer electrode is electrically connected to a ground pattern provided within the interposer or on a lower surface of the interposer.

2. The capacitor mounting structure according to claim 1, wherein the first inner electrodes and the second inner electrodes of the capacitor are perpendicular or substantially perpendicular to an upper surface of the substrate.

3. The capacitor mounting structure according to claim 1, wherein the third outer electrode is an electrode provided continuously on the pair of side surfaces and a pair of surfaces orthogonal or substantially orthogonal to the pair of side surfaces and orthogonal or substantially orthogonal to the pair of end surfaces.

4. The capacitor mounting structure according to claim 1, wherein
   the first outer electrode is included within the interposer;
   the second outer electrode is located outside the interposer and along an upper surface of the substrate; and
   at least a portion of the third outer electrode is included within the interposer.

5. The capacitor mounting structure according to claim 1, wherein the first outer electrode is parallel or substantially parallel to an upper surface of the interposer.

6. The capacitor mounting structure according to claim 1, wherein the interposer includes silicon.

7. The capacitor mounting structure according to claim 1, wherein the capacitor is included in a plurality of capacitors that are each electrically connected between the ground and the power supply of the semiconductor integrated circuit.

8. The capacitor mounting structure according to claim 1, wherein the semiconductor integrated circuit is included in a silicon die.

9. The capacitor mounting structure according to claim 8, wherein
   the silicon die is mounted to the interposer by a board; and
   the board is located between the silicon die and the interposer.

10. The capacitor mounting structure according to claim 1, wherein the interposer is a multilayer wiring board in which a plurality of wiring layers and a plurality of insulator layers are laminated.

11. The capacitor mounting structure according to claim 1, further comprising a second capacitor mounted on a surface of the substrate.

12. The capacitor mounting structure according to claim 1, wherein the capacitor includes a rectangular parallelepiped or a substantially rectangular parallelepiped shape.

13. The capacitor mounting structure according to claim 1, wherein each of the first inner electrodes includes a main body portion, a first extended portion that is electrically connected to the first outer electrode, and a second extended portion that is electrically connected to the second outer electrode.

14. The capacitor mounting structure according to claim 1, wherein each of the second inner electrodes includes a main body portion, a first extended portion that is electrically connected to the third outer electrode, and a second extended portion that is electrically connected to the third outer electrode.

15. The capacitor mounting structure according to claim 1, wherein each of the first outer electrode, the second outer electrode, and the third outer electrode includes a copper electrode and a plating layer.

16. The capacitor mounting structure according to claim 1, wherein each of the dielectric layers includes a dielectric ceramic material.

17. The capacitor mounting structure according to claim 1, wherein the third outer electrode is electrically connected to a ground pattern provided on a surface of the interposer.

18. The capacitor mounting structure according to claim 1, wherein the third outer electrode is electrically connected to a power supply pattern included in the interposer.

19. A capacitor mounting structure comprising:
   a semiconductor integrated circuit;
   a substrate;
   an interposer located between the semiconductor integrated circuit and the substrate; and
   a capacitor electrically connected between ground and a power supply of the semiconductor integrated circuit;
   wherein
   the capacitor includes a multilayer body in which first inner electrodes and second inner electrodes are alternately laminated with dielectric layers interposed therebetween, a first outer electrode provided on one end surface of the multilayer body and connected to the first inner electrodes, a second outer electrode provided on another end surface opposing the one end surface of the multilayer body and connected to the first inner electrodes, and a third outer electrode provided on a pair of opposing side surfaces of the multilayer body and connected to the second inner electrodes, and a portion of the capacitor at the first outer electrode side is embedded within the interposer;
   the first outer electrode is electrically connected to a ground terminal of the semiconductor integrated circuit through a via provided within the interposer;
   the second outer electrode isw electrically connected to a ground pattern on the substrate; and
   the third outer electrode is electrically connected to a power supply pattern provided within the interposer or on a lower surface of the interposer.

20. The capacitor mounting structure according to claim 19, wherein the interposer is a multilayer wiring board in which a plurality of wiring layers and a plurality of insulator layers are laminated.

* * * * *